US012176020B2

(12) United States Patent
Simsek-Ege et al.

(10) Patent No.: US 12,176,020 B2
(45) Date of Patent: Dec. 24, 2024

(54) STRUCTURES FOR WORD LINE MULTIPLEXING IN THREE-DIMENSIONAL MEMORY ARRAYS

(71) Applicant: Micron Technology, Inc., Boise, ID (US)

(72) Inventors: Fatma Arzum Simsek-Ege, Boise, ID (US); Mingdong Cui, Folsom, CA (US); Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 17/821,645

(22) Filed: Aug. 23, 2022

(65) Prior Publication Data

US 2024/0071465 A1 Feb. 29, 2024

(51) Int. Cl.
*G11C 8/14* (2006.01)
*G11C 5/02* (2006.01)
*G11C 11/22* (2006.01)
*G11C 11/408* (2006.01)
*G11C 11/4091* (2006.01)
*G11C 5/06* (2006.01)
*G11C 11/401* (2006.01)

(52) U.S. Cl.
CPC .......... *G11C 11/4085* (2013.01); *G11C 5/025* (2013.01); *G11C 11/2257* (2013.01); *G11C 11/4091* (2013.01); *G11C 5/066* (2013.01); *G11C 8/14* (2013.01); *G11C 11/401* (2013.01)

(58) Field of Classification Search
CPC . G11C 11/4085; G11C 5/025; G11C 11/2257; G11C 11/4091; G11C 5/066; G11C 8/14; G11C 11/401; H10B 43/27
See application file for complete search history.

(56) References Cited

U.S. PATENT DOCUMENTS

| | | | | |
|---|---|---|---|---|
| 2021/0408038 A1* | 12/2021 | Lin | ................... | H10B 43/27 |
| 2022/0028440 A1* | 1/2022 | Tang | ................... | H10B 43/10 |
| 2022/0068797 A1* | 3/2022 | Xue | ................... | H10B 43/27 |
| 2022/0139950 A1* | 5/2022 | Guo | ................... | H10B 41/27 |
| | | | | 257/314 |
| 2022/0270972 A1* | 8/2022 | Wang | ................... | H10B 41/10 |
| 2022/0278128 A1* | 9/2022 | Young | ................... | H10B 51/40 |
| 2022/0285351 A1* | 9/2022 | He | ................... | G11C 11/4097 |

\* cited by examiner

*Primary Examiner* — Mushfique Siddique
(74) *Attorney, Agent, or Firm* — Holland & Hart LLP

(57) ABSTRACT

Methods, systems, and devices for structures for word line multiplexing in three-dimensional memory arrays are described. A memory die may include circuitry for access line multiplexing in regions adjacent to or between staircase regions. For example, a multiplexing region may include, for each word line of a stack of word lines, a respective first portion of a semiconductor material and a respective second portion of the semiconductor material, and may also include a gate material operable to modulate a conductivity between the first portions and the second portions. Each word line may be coupled with the respective first portion of the semiconductor material, such that biasing of the gate material may couple the word lines with the respective second portion of the semiconductor material. Such features may support various techniques for multiplexing associated with the stack of word lines, or among multiple stacks of word lines, or both.

25 Claims, 7 Drawing Sheets

▨ Semiconductor Material 230   ▨ Conductive Material 255

☐ Dielectric Material 240

▦ Semiconductor Material 230      ▨ Conductive Material 255

☐ Dielectric Material 240

US 12,176,020 B2

STRUCTURES FOR WORD LINE MULTIPLEXING IN THREE-DIMENSIONAL MEMORY ARRAYS

FIELD OF TECHNOLOGY

The following relates to one or more systems for memory, including structures for word line multiplexing in three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
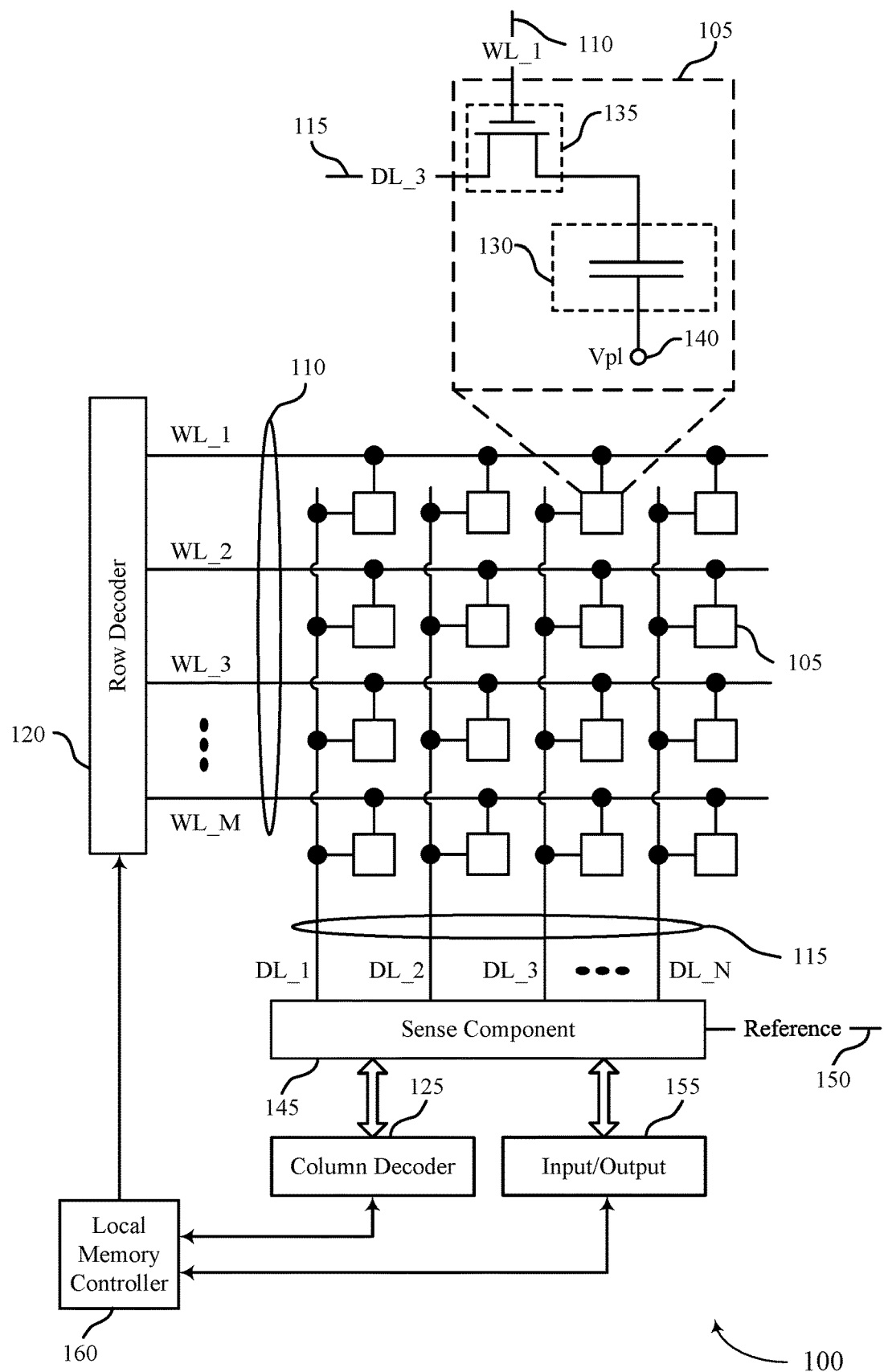
FIG. 1 illustrates an example of a memory die that supports structures for word line multiplexing in three-dimensional memory arrays in accordance with examples as disclosed herein.

Manufacturing of memory dies (e.g., memory devices, memory arrays) may involve forming various materials over a substrate, such as a semiconductor substrate (e.g., a wafer of crystalline semiconductor). In some cases, a portion of a memory die may be formed by forming alternating layers of a first material and a second material over the substrate. Voids may be formed between layers of the first material by removing portions of the second material, and a third material (e.g., a conductive material) may be formed in the voids to form access line conductors for accessing memory cells of the memory die. In some examples, stacks of access lines conductors (e.g., a stack of access line conductors that are arranged along a height dimension of the memory die) may extend into respective staircase regions of the memory die, in which access lines of a respective stack may have different extents along a direction parallel to the substrate. The different extents of the access lines in the staircase region may support the formation of electrical contacts (e.g., conductive pillars, vertical pillars, electrical couplings), along a height dimension of the memory die, for each of the access lines of a stack (e.g., associated with each 'step' of a staircase arrangement of the access lines), which may support independently accessing (e.g., selecting, biasing) each of the access lines. In some implementations, however, regions above the substrate that are adjacent to or between staircase regions may not be utilized for active circuitry of the memory die.

In accordance with examples as disclosed herein, a memory die may include circuitry for access line multiplexing, such as word line multiplexing, in regions of the memory die adjacent to or between staircase regions. For example, a multiplexing region adjacent to a staircase region may include, for each word line of a stack of word lines in the staircase region, a respective first portion of a semiconductor material and a respective second portion of the semiconductor material, and may also include a gate material (e.g., one or more gate material portions) operable to modulate a conductivity (e.g., close or open an electrical path, establish an electrical coupling, establish an electrical isolation) between the first portions and the second portions of the semiconductor material. Each of the word lines of the stack of word lines may be coupled with the respective first portion of the semiconductor material (e.g., via one or more electrical contacts or traces), such that biasing of the gate material may be operable to couple or isolate the word lines and the respective second portion of the semiconductor material. In some examples, such features may support various techniques for multiplexing associated with the stack of word lines, or among multiple stacks of word lines (e.g., of a set of multiple staircase regions), or both, and therefore utilize a region of the memory die that might be otherwise unused for active circuitry of the memory die.

Features of the disclosure are initially described in the context of a memory die as described with reference to FIG. 1. Features of the disclosure are described in the context of material arrangements and related manufacturing operations as described with reference to FIGS. 2A through 5B. These and other features of the disclosure are further illustrated by and described with reference to a flowchart that relates to structures for word line multiplexing in three-dimensional memory arrays as described with reference to FIG. 6.

FIG. 1 illustrates an example of a memory die 100 that supports structures for word line multiplexing in three-dimensional memory arrays in accordance with examples as disclosed herein. In some examples, the memory die 100 may be referred to as a memory chip, a memory device, a memory array, or an electronic memory apparatus. The memory die 100 may include one or more memory cells 105 that may be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

In some examples, a memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 105 may include a logic storage component, such as capacitor 130, and a switching component 135 (e.g., a cell selection component). The capacitor 130 may be an example of a dielectric capacitor or a ferroelectric capacitor. A node of the capacitor 130 may be coupled with a voltage source 140, which may be the cell plate reference voltage, such as Vpl, or may be ground, such as Vss.

The memory die 100 may include access lines (e.g., word lines 110, digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding, memory cells 105 may be positioned at intersections of the word lines 110 and the digit lines 115.

Operations such as reading and writing may be performed on the memory cells 105 by activating access lines such as a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in a two-dimensional or in a three-dimensional configuration may be referred to as an address of a memory cell 105. Activating a word line 110 or a digit line 115 may include applying a voltage to the respective line.

Accessing the memory cells 105 may be controlled through a row decoder 120, or a column decoder 125, or any combination thereof. For example, a row decoder 120 may receive a row address from the local memory controller 160 and activate a word line 110 based on the received row address. A column decoder 125 may receive a column address from the local memory controller 160 and may activate a digit line 115 based on the received column address.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

A word line 110 may be a conductive line in electronic communication with a memory cell 105 that is used to perform access operations on the memory cell 105. In some architectures, the word line 110 may be coupled with a gate of a switching component 135 of a memory cell 105 and may be operable to control the switching component 135 of the memory cell. In some architectures, the word line 110 may be coupled with a node of the capacitor of the memory cell 105 and the memory cell 105 may not include a switching component.

A digit line 115 may be a conductive line that couples the memory cell 105 with a sense component 145. In some architectures, the memory cell 105 may be selectively coupled with the digit line 115 during portions of an access operation. For example, the word line 110 and the switching component 135 of the memory cell 105 may be operable to couple or isolate the capacitor 130 of the memory cell 105 and the digit line 115. In some architectures, the memory cell 105 may be coupled with the digit line 115.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory die 100.

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with the local memory controller 160. The local memory controller 160 may be operable to receive one or more of commands or data from one or more different memory controllers (e.g., an external memory controller associated with a host device, another controller associated with the memory die 100), translate the commands or the data (or both) into information that can be used by the memory die 100, perform one or more operations on the memory die 100, and communicate data from the memory die 100 to a host (e.g., a host device) based on performing the one or more operations. The local memory controller 160 may generate row signals and column address signals to activate the target word line 110 and the target digit line 115. The local memory controller 160 also may generate and control various signals (e.g., voltages, currents) used during the operation of the memory die 100. In general, the amplitude, the shape, or the duration of an applied voltage or current discussed herein may be varied and may be different for the various operations discussed in operating the memory die 100.

The local memory controller 160 may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device). The local memory controller 160 may be operable to perform other access operations not listed here or other operations related to the operating of the memory die 100 that are not directly related to accessing the memory cells 105.

The local memory controller 160 may be operable to perform a write operation (e.g., a programming operation) on one or more memory cells 105 of the memory die 100.

During a write operation, a memory cell 105 of the memory die 100 may be programmed to store a desired state (e.g., logic state, charge state). The local memory controller 160 may identify a target memory cell 105 on which to perform the write operation. The local memory controller 160 may identify a target word line 110 and a target digit line 115 coupled with the target memory cell 105 (e.g., an address of the target memory cell 105). The local memory controller 160 may activate the target word line 110 and the target digit line 115 (e.g., applying a voltage to the word line 110 or digit line 115) to access the target memory cell 105. The local memory controller 160 may apply a signal (e.g., a write pulse, a write voltage) to the digit line 115 during the write operation to store a specific state (e.g., charge) in the capacitor 130 of the memory cell 105. The signal used as part of the write operation may include one or more voltage levels over a duration.

The local memory controller 160 may be operable to perform a read operation (e.g., a sense operation) on one or more memory cells 105 of the memory die 100. During a read operation, the state (e.g., logic state, charge state) stored in a memory cell 105 of the memory die 100 may be evaluated (e.g., read, determined, identified). The local memory controller 160 may identify a target memory cell 105 on which to perform the read operation. The local memory controller 160 may identify a target word line 110 and a target digit line 115 coupled with the target memory cell 105 (e.g., the address of the target memory cell 105). The local memory controller 160 may activate the target word line 110 and the target digit line 115 (e.g., applying a voltage to the word line 110 or digit line 115) to access the target memory cell 105. The target memory cell 105 may transfer a signal (e.g., charge, voltage) to the sense component 145 in response to biasing the access lines. The sense component 145 may amplify the signal. The local memory controller 160 may activate the sense component 145 (e.g., latch the sense component) and compare the signal received from the memory cell 105 to a reference (e.g., the reference 150). Based on that comparison, the sense component 145 may determine a logic state that is stored on the memory cell 105.

Manufacturing of the memory die 100 may involve forming various materials over a substrate, such as a semiconductor substrate. In some cases, a portion of the memory die 100 may be formed by forming alternating layers of a first material and a second material over the substrate. Voids may be formed between layers of the first material by removing portions of the second material, and a third material (e.g., a conductive material) may be formed in the voids to form access line conductors, such as conductors for word lines 110 (e.g., word line conductors). In some examples, stacks of word lines 110 (e.g., a stack of word line conductors that are arranged along a height dimension of the memory die 100) may extend into respective staircase regions of the memory die 100, in which word lines 110 of a respective stack may have different extents along a direction parallel to the substrate. The different extents of the word lines 110 in the staircase region may support the formation of electrical contacts (e.g., conductive pillars, vertical pillars), along a height dimension of the memory die 100, for each of the word lines 110 of a stack (e.g., associated with each 'step' of a staircase arrangement of the word lines 110), which may support independently accessing (e.g., selecting, biasing) each of the word lines 110.

In accordance with examples as disclosed herein, the memory die 100 may include circuitry for access line multiplexing, such as multiplexing of word lines 110 (e.g., as at least a portion of a row decoder 120), in regions of the memory die 100 adjacent to or between staircase regions. For example, a multiplexing region adjacent to a staircase region may include, for each word line 110 of a stack of word lines 110 associated with the staircase region, a respective first portion of a semiconductor material and a respective second portion of the semiconductor material, and may also include a gate material operable to modulate a conductivity (e.g., close or open an electrical path, establish an electrical coupling, establish an electrical isolation) between the first portions and the second portions of the semiconductor material. Each of the word lines 110 of the stack of word lines 110 may be coupled with the respective first portion of the semiconductor material (e.g., via one or more electrical contacts or traces), such that biasing of the gate material may be operable to couple the word lines 110 with the respective second portion of the semiconductor material. In some examples, such features may support various techniques for multiplexing associated with the stack of word lines 110, or among multiple stacks of word lines 110 (e.g., associated with a set of multiple staircase regions), or both, and therefore utilize a region of the memory die 100 that might be otherwise unused for active circuitry of the memory die 100.

FIGS. 2A through 5B illustrate examples of material arrangements that support structures for word line multiplexing in three-dimensional memory arrays in accordance with examples as disclosed herein. For example, FIGS. 2A through 5B may illustrate aspects of operations for fabricating aspects of a material arrangement 200 and a material arrangement 300, which each may illustrate an arrangement of materials over a substrate (e.g., a semiconductor substrate, a semiconductor wafer, a crystalline semiconductor). Each of the material arrangements 200 and 300 may be described with reference to an x-direction (e.g., a direction over the substrate, such as parallel to the substrate), a y-direction (e.g., another direction over the substrate, such as parallel to the substrate, which may be perpendicular or otherwise skewed relative to the x-direction), and a z-direction (e.g., a direction from the substrate, such as a height direction or a thickness direction relative to the substrate), as illustrated. In some examples, each of the material arrangements 200 and 300 may be a representation of a portion of a memory die 100 as described with reference to FIG. 1. Although each of the material arrangements 200 and 300 illustrate examples of some relative dimensions and quantities of various features, aspects of each respective material arrangement may be implemented with other relative dimensions or quantities of such features in accordance with examples as described herein. In some cases, a view of a material arrangement may show structures that are beneath other structures. By making some upper layers transparent, some details (such as contacts) may be viewed, which may illustrate examples of relative positions of elements and features.

Operations illustrated in and described with reference to FIGS. 2A through 5B may be performed by a manufacturing system, such as a semiconductor fabrication system configured to perform additive operations (e.g., depositing, epitaxy, bonding), subtractive operations (e.g., etching, trenching, planarizing, polishing), modifying operations (e.g., oxidizing, doping, reacting, converting), and supporting operations (e.g., masking, patterning, photolithography, aligning), among other operations of formation that support the described techniques. In some cases, operations performed by such a manufacturing system may be supported by a process controller or its components as described herein.

Figure 2A:
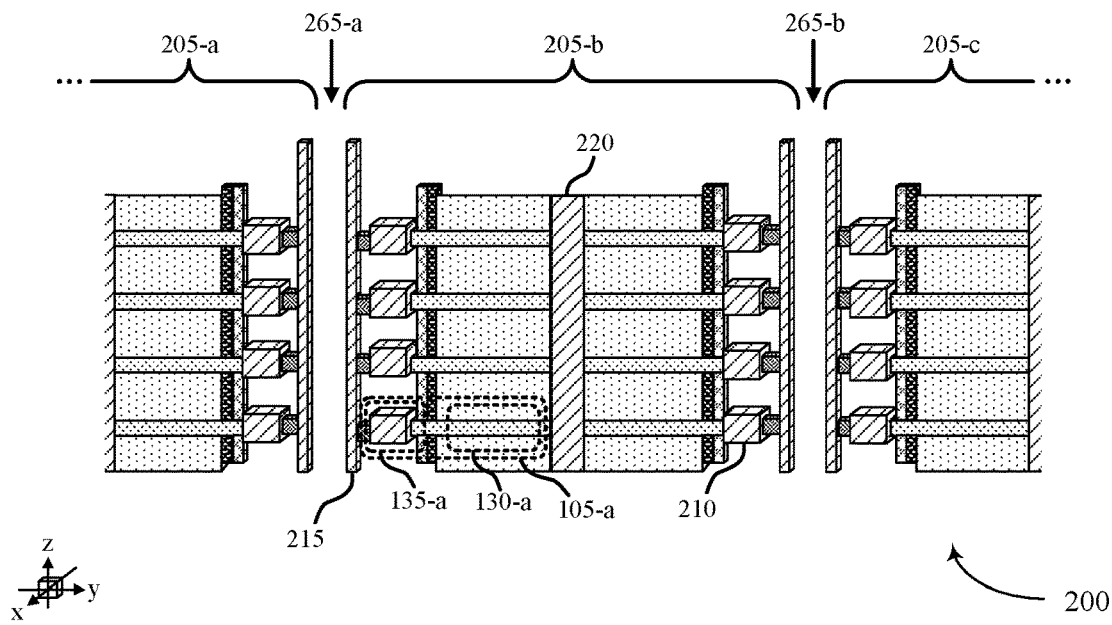
FIGS. 2A-5B illustrate examples of material arrangements that support structures for word line multiplexing in three-dimensional memory arrays in accordance with examples as disclosed herein.
Figure 2B:
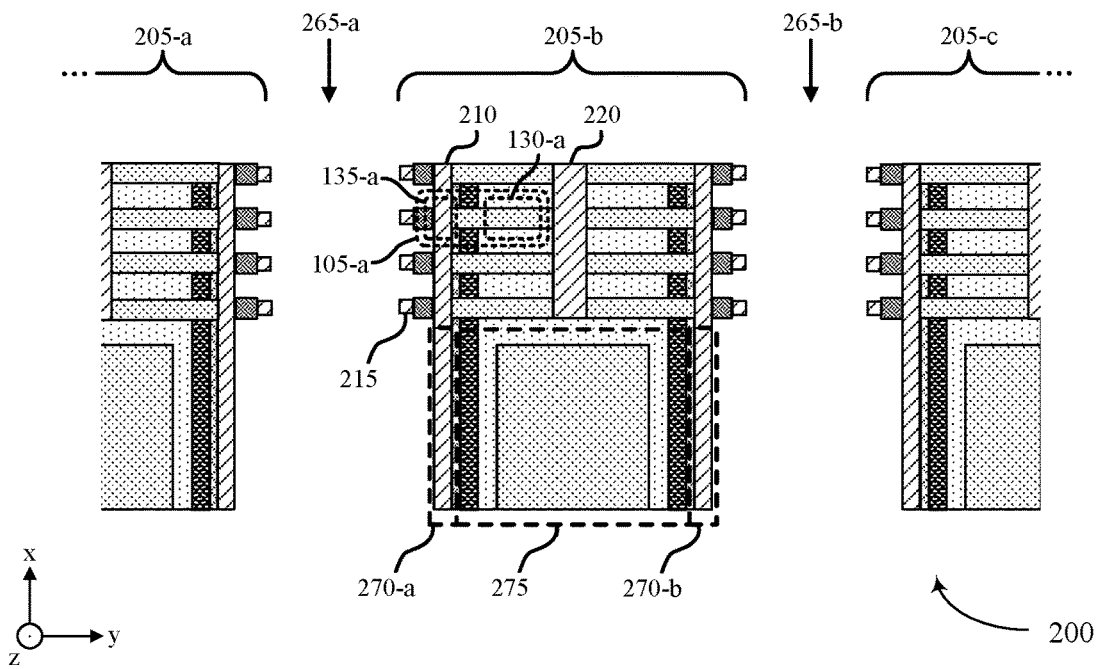

FIGS. 2A and 2B illustrate a material arrangement 200 that supports structures for word line multiplexing in three-dimensional memory arrays in accordance with examples as disclosed herein. For example, FIG. 2A illustrates a cross-section of a portion of the material arrangement 200 in a yz-plane and FIG. 2B illustrates a cross-section of a portion of the material arrangement 200 in an xy-plane. Aspects of the material arrangement 200 may be described with reference to regions 205. Each region 205 may include a respective three-dimensional array of memory cells 105 (e.g., memory cell 105-a), and each memory cell 105 may include a respective capacitor 130 (e.g., capacitor 130-a, a capacitance between electrical nodes that is supported by formed material portions) and a respective switching component 135 (e.g., switching component 135-a, a material portion operable to couple the capacitor 130-a with a access line, such as a digit line 115). Each region 205 also may include a set of word line conductors 210, each of which may be a portion of a word line 110, and a set of digit line conductors 215, each of which may be a portion of a digit line 115.

Each region 205 may also include a plate conductor 220, which may be an example of a plate node of the material arrangement 200 that is coupled with a plate voltage source, such as a voltage source 140. In the example of material arrangement 200, each word line conductor 210 may extend along the x-direction, and a set of multiple word line conductors 210 (e.g., a stack of word line conductors 210) may be arranged along the z-direction, such that each word line conductor 210 of a stack is associated with a location and an extent along the z-direction. The example of material arrangement 200 illustrates an example in which each region 205 includes a stack of word line conductors 210 on both sides (e.g., along the y-direction) of a plate conductor 220 but, in some other examples, a material arrangement in accordance with the disclosed techniques may include a stack of word line conductors 210 on a single side of a plate conductor 220, among other configurations. In the example of material arrangement 200, each digit line conductor 215 may extend along the z-direction, and a set of multiple digit line conductors 215 may be arranged along the x-direction. Each word line conductor 210 may be operable to couple a respective capacitor 130 with each digit line conductor 215 of a set of one or more digit line conductors along the x-direction.

The regions 205 may be separated from one another by isolation regions 265 (e.g., a trench, a trench isolation region), which may include one or more dielectric materials (not shown) that support an electrical isolation between at least portions of the regions 205. In the example of the material arrangement 200, the regions 205-a and 205-c may include features similar or identical to the region 205-b, but are truncated for illustrative purposes. In some cases, one or more isolation regions 265 (e.g., an isolation region 265-a and an isolation region 265-b) may extend along the z-direction, but other isolation regions may extend along other directions, such as around a perimeter of a region 205 or at least partially enclosing a volume of a region 205.

The material arrangement 200 may be an example of a portion of a memory die 100 after a set of one or more manufacturing operations. For example, forming the material arrangement 200 may include forming a stack (e.g., extending along the z-direction) of (e.g., including) alternating layers of a material 225 and a semiconductor material 230 (e.g., silicon, epitaxial silicon). In some examples, the material 225 as illustrated may be a sacrificial material (e.g., silicon germanium), which may be deposited or otherwise formed in layers with (e.g., between) layers of the semiconductor material 230, and which may be removed (e.g., exhumed) in a later operation and replaced with another material, such as a dielectric material (e.g., silicon nitride) to provide an electrical isolation (e.g., along the z-direction, between layers of the semiconductor material 230). In some other examples, the material 225 as illustrated may be a dielectric material (e.g., silicon nitride) which, in various examples, may be deposited or otherwise formed in layers with (e.g., between) layers of the semiconductor material 230, or may be illustrative of a material that replaced a sacrificial material (e.g., after a removal of the sacrificial material, such as in an exhume operation) that was formed (e.g., deposited, oxidized) between layers of the semiconductor material 230.

In some cases, forming the material arrangement 200 may be supported by forming a stack of alternating layers (e.g., alternating layers of the semiconductor material 230 and the material 225, or a material that may be removed to form voids in which the material 225 may be formed) over a substrate (e.g., a semiconductor wafer, a substrate of crystalline semiconductor, not shown). For illustrative purposes, a stack of alternating layers supporting the formation of the material arrangement 200, may include five layers of the material 225 and four layers of the semiconductor material 230. However, a stack of alternating layers may include any quantity of layers of the material 225 and any quantity of layers of the semiconductor material 230.

Forming the material arrangement 200 may also include forming one or more trenches through the stack of alternating layers. As described herein, a trench may refer to a region formed by a subtractive operation (e.g., a dry etch operation, a wet etch operation) where one or more materials (e.g., material layers) are removed along the z-direction via an opening that may be elongated along one or more directions in an xy-plane (e.g., along the x-direction, along the y-direction, along other directions or combinations of directions, at an exposed surface of the memory die), which may include trenching around a perimeter of a portion of a material arrangement. For example, the first manufacturing operation may include forming a stack of alternating layers that is continuous through the region 205-a, the region 205-b, and the region 205-c. Two trenches may be formed such that the stack of alternating layers is separated between the region 205-a, the region 205-b, and the region 205-c. In some cases, forming the material arrangement 200 may include forming (e.g., depositing) a layer of a masking material (e.g., a hard mask, not shown) over the stack of alternating layers. The layer of the masking material may be formed over the stack of alternating layers (e.g., over a top layer of the material 225, over a top layer of the semiconductor material 230), and may support various photolithography operations (e.g., patterning openings for trenches or other cavities).

In some cases, forming the material arrangement 200 may include forming voids (e.g., recesses) between one or more layers of the material 225, between one or more layers of the semiconductor material 230, or both. In some examples, forming a void (e.g., forming a recess, exhuming) may refer at least in part to removing one or more materials (e.g., sacrificial materials) between layers of material that are not removed, which may include a material removal along a direction in an xy-plane. For example, a trench may be used to access and form a void between layers of the semiconductor material 230 (e.g., a void in one or more layers of a sacrificial material, via an exposed sidewall of the sacrificial material). In some cases, a void may be formed by an etching operation (e.g., a wet etch operation), which may expose sidewalls of a material (e.g., the material 225). In some examples, the etching operation may expose surfaces of a material (e.g., the material 225) in an xz-plane, in a yz-plane, or a combination thereof. In some examples, an etching operation may remove one or more portions of a sacrificial material. For example, the etching operation may offset, along the x-direction, along the y-direction, or both, portions of (e.g., sidewalls of) one or more layers of the sacrificial material.

In some examples, forming the material arrangement 200 may include forming a dielectric material 245 (e.g., a film of an inter-tier dielectric (ITD)), which may include a formation at least on sidewalls of the material 225. The dielectric material 245 may be formed (e.g., deposited) on exposed sidewalls (e.g., sidewalls in at least an xz-plane) of one or more layers of the material 225. Although the material arrangement 200 illustrates an example in which each layer of the semiconductor material 230 intersects the dielectric material 245, in some other examples, one or more layers of the semiconductor material 230 may not intersect the dielectric material 245, or the dielectric material 245 may be formed in another configuration or omitted. In some cases, the dielectric material 245 may be silicon nitride.

Additionally, or alternatively, forming the material arrangement 200 may also include forming layers of a gate oxide material 250. In some examples, the gate oxide material 250 may be formed on sidewalls of the layers of the dielectric material 245. Layers of the gate oxide material 250 may extend along directions in an xz-plane and may be formed (e.g., deposited) on one or more extents (e.g., along the y-direction) of a respective layer of the dielectric material 245. For example, the region 205-b may include two layers of the gate oxide material 250. Although the material arrangement 200 illustrates an example in which each layer of the semiconductor material 230 intersects the gate oxide material 250, in some other examples, one or more layers of the semiconductor material 230 may not intersect the gate oxide material 250, or the gate oxide material 250 may be formed in another configuration or omitted. In some cases, the gate oxide material 250 may be germanium oxide.

Forming the material arrangement 200 may also include forming one or more word line conductors 210 using a conductive material 255. The one or more word line conductors 210 may extend along the x-direction. In some cases, the one or more word line conductors 210 may be formed to bypass or surround (e.g., enclose, in an xz-plane) around the semiconductor material 230. In some examples, a portion of a word line conductor 210 that bypasses or surrounds a portion of the semiconductor material 230 may support a gate portion of a switching component 135, and the portion of the semiconductor material 230 may support a channel portion of the switching component 135. In some examples, the portion of the word line conductor 210 may be separated from the portion of the semiconductor material 230 by a gate oxide material, which may be the same as the gate oxide material 250 (e.g., germanium oxide), or may be a different material than the gate oxide material 250, or may be implemented in the absence of the gate oxide material 250. In some cases, the conductive material 255 may be titanium nitride.

Forming the material arrangement 200 may also include forming one or more digit line conductors 215 and one or more plate conductors 220 using the conductive material 255. The digit line conductors 215 may extend along the z-direction. In some examples, the digit line conductors 215 may be coupled (e.g., physically, electrically) between respective doped regions 260 (e.g., of the semiconductor material 230), in which case the respective doped regions 260 also may support a channel portion of a respective switching component 135. The plate conductors 220 may extend along the z-direction and may be electrically coupled with respective layers of semiconductor material 230. In some cases, forming plate conductors 220 may occur prior forming the stack of alternating layers of the material 225 and the semiconductor material 230. In some other cases, forming plate conductors 220 may occur after forming the stack of alternating layers of the material 225 and the semiconductor material 230 (e.g., by forming a trench through the stack and depositing the conductive material 255 in the trench).

The material arrangement 200 also may include one or more capacitors 130, which may support storing a charge corresponding to a stored logic state of the memory cell 105. In some cases, each capacitor 130 of a two-dimensional set (e.g., in an xz-plane) may be coupled with a same plate conductor 220, and a plate conductor 220 may be coupled between two of such two-dimensional sets of capacitors 130. The capacitors 130 may each be operable to couple with a digit line conductor 215 based on a voltage applied to a respective switching component 135 via a word line conductor 210. In some examples, the capacitors 130 may utilize an intrinsic capacitance of the semiconductor material 230 between a respective switching component 135 and a respective plate conductor 220. In some other examples, a capacitor 130 may be supported by one or more other materials, not shown, that otherwise support such a capacitance.

In some cases, word line conductors 210 may extend along the x-direction into staircase regions 270. For example, a first stack of word line conductors 210 may extend into a staircase region 270-a and a second stack of word line conductors 210 may extend into a staircase region 270-b. Although not shown in FIG. 2, each word line conductor 210 of a stack (e.g., along the z-direction) may have a different extent (e.g., length, along the x-direction) in a staircase region 270. That is, a staircase region 270 may include a respective portion of multiple word line conductors 210 (e.g., stacks of word line conductors 210), and each word line conductor 210 may have a different extent along the x-direction, thereby forming a staircase structure. In accordance with examples as disclosed herein, a memory die 100 may include circuitry that is adjacent to or between staircase regions 270 (e.g., in a region 275), which may include circuitry for multiplexing word line conductors 210.

Figure 3A:
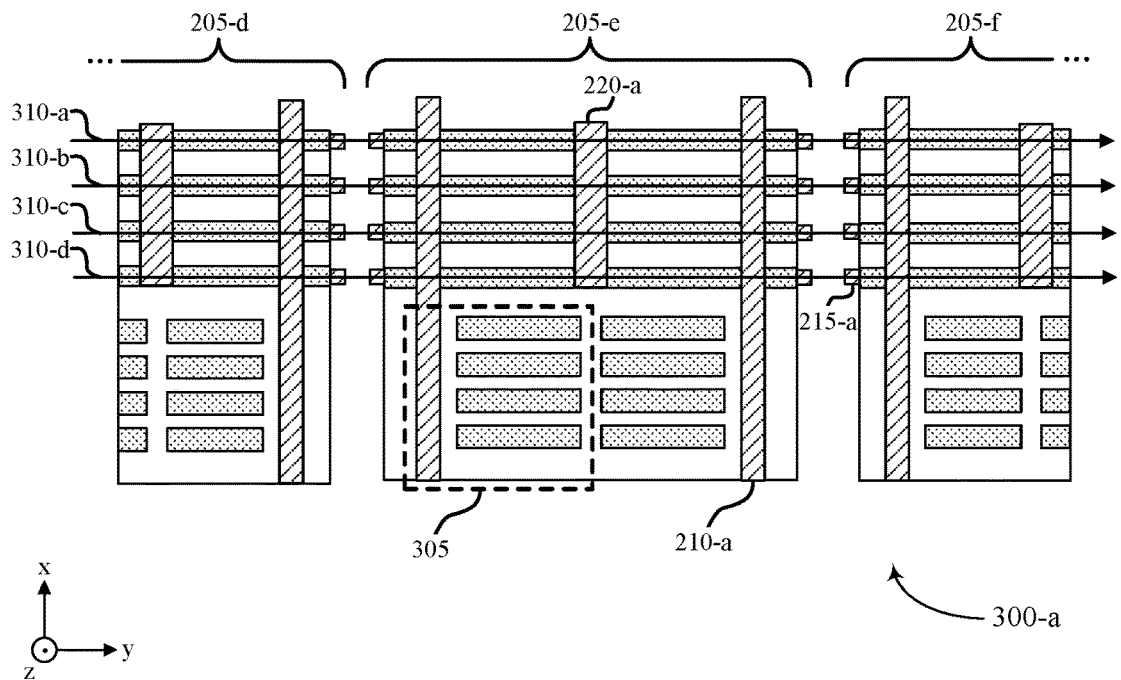
Figure 3B:
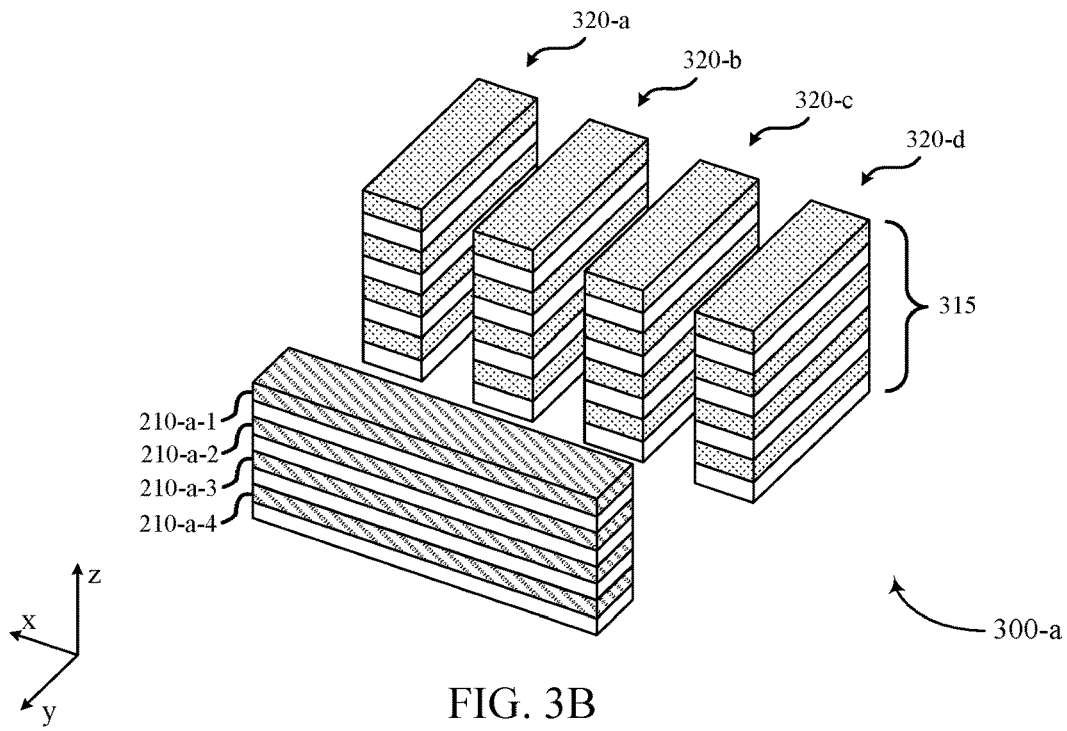

FIGS. 3A and 3B illustrate an example of a material arrangement 300 (e.g., as a material arrangement 300-a) that supports structures for word line multiplexing in three-dimensional memory arrays in accordance with examples as disclosed herein. The material arrangement 300-a (e.g., the memory die 100) may be described with reference to regions 205, which may be examples of regions 205 as described with reference to FIG. 2. For example, each region 205 may include word line conductors 210-a, digit line conductors 215-a, and plate conductors 220-a, which may support accessing a three-dimensional array of memory cells 105 (e.g., accessing capacitors 130-a via switching components 135-a). FIG. 3B may illustrate an isometric view of a region 305 of the material arrangement 300-a (e.g., including a staircase region 270 and at least a portion of a region 275), shown in top view in FIG. 3A, which may correspond to a multiplexing region for a subset of word line conductors 210 of a region 205.

The material arrangement 300-*a* may show a portion of a memory die 100 after a first set of one or more manufacturing operations, which may include one or more same or similar operations associated with forming the material arrangement 200. For example, the first set of operations may include forming a stack of material layers over a substrate of a memory die (e.g., a semiconductor substrate, a crystalline semiconductor wafer). In some examples, at least a portion of the formed material layers may be represented by a stack 315, which may include alternating layers (e.g., along the z-direction) of the semiconductor material 230 and the dielectric material 240. In some examples, the first set of operations may include an epitaxial formation (e.g., growth) of the semiconductor material 230 (e.g., as epitaxial silicon or other semiconductor). The semiconductor material 230 of the stack 315 may be the same material (e.g., formed in a common operation) that is used to form channel portions of the switching components 135 that are operable to be activated using the word line conductors 210-*a*. Although FIG. 3B shows intervening trenches between islands 320 of the stack 315, the phrase "stack 315" may generally refer to a continuous stack of material layers (e.g., without intervening trenches) prior to the formation of islands 320.

In some examples, forming the stack 315 may include forming (e.g., depositing) layers of the dielectric material 240 on top of or between layers of the formed semiconductor material 230. In some other examples, a sacrificial material (e.g., silicon germanium) may be formed (e.g., deposited) on or between layers of the semiconductor material 230, and the dielectric material 240 may be formed (e.g., deposited, oxidized) in voids formed by removing the sacrificial material (e.g., in at least staircase regions 270 and regions 275). In some examples, the first set of operations also may include forming islands 320 of the stack 315 (e.g., in a region 275), which may include removing (e.g., trenching) layers of the semiconductor material 230 and the dielectric material 240 from around (e.g., from along or around a perimeter of) each island 320, although islands 320 may be formed in accordance with other techniques.

The first set of operations also may include forming word line conductors 210-*a*, which may be arranged in a stack along the z-direction. Each word line conductor 210-*a* may extend along the x-direction, and may be operable to access (e.g., select) a respective set of one or more memory cells 105 (e.g., a set of memory cells 105 along the x-direction, which may correspond to a tier of memory cells 105 along the z-direction that is associated with a position along the z-direction of the respective word line conductor 210-*a*). In some examples, the forming the word line conductors 210-*a* may include forming (e.g., depositing) the conductive material 255, or a different conductive material, on or between layers of the dielectric material 240. In some examples, a region of the material arrangement 200 associated with the word line conductors 210-*a* (e.g., staircase regions 270) may be associated with the same materials as the stack 315, and forming the word line conductors 210-*a* may include forming (e.g., depositing) the conductive material 255 in voids formed by removing the semiconductor material 230 from the formed stack of material layers (e.g., in the region associated with the word line conductors 210-*a*, in regions 305, in staircase regions 270). Accordingly, the extents along the z-direction of the conductive material 255 of each word line conductor 210-*a* may be at least partially overlapping, along the z-direction, with a corresponding layer of the semiconductor material 230 of the islands 320 (e.g., in accordance with the formation of layers of the stack 315). However, the stack of word line conductors 210-*a* may be formed in accordance with other techniques.

In some examples, the first set of manufacturing operations may also include forming one or more global digit lines 310 (e.g., a global digit line 310-*a*, a global digit line 310-*b*, a global digit line 310-*c*, and a global digit line 310-*d*). In some examples, the global digit lines 310 may be formed above the word line conductors 210-*a* and the plate conductors 220-*a* (e.g., along the z-direction), or below the word line conductors 210-*a* and the plate conductors 220-*a*. Each global digit line 310 may be electrically coupled (e.g., directly coupled, coupled via one or more switching components, not shown) with a set of digit line conductors 215-*a* (e.g., a set of digit line conductors 215-*a* arranged along the y-direction), and each global digit line 310 may be coupled with a sense component 145. Thus, a global digit line 310 may support conveying signals between the sense component 145 and one or more digit line conductors 215-*a* (e.g., of one or more regions 205 of the material arrangement 300). In some examples, the global digit lines 310 may be formed from a conductive material, such as the conductive material 255 or a different conductive material.

Figure 4A:
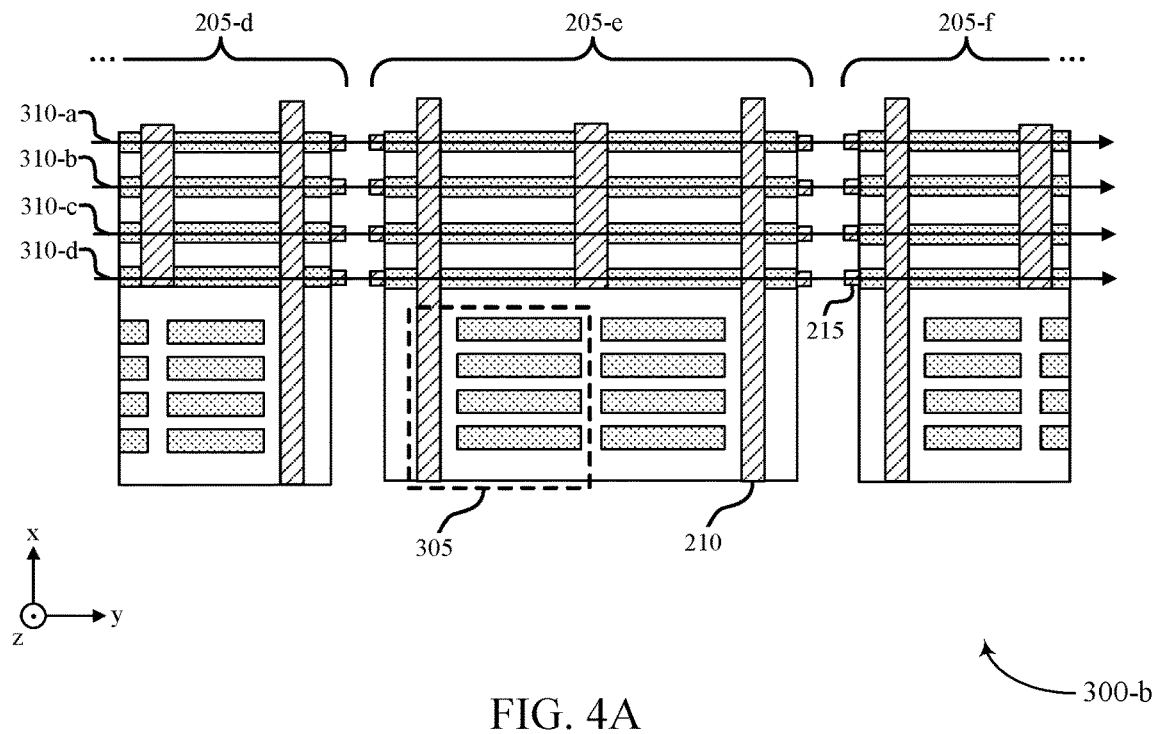
Figure 4B:
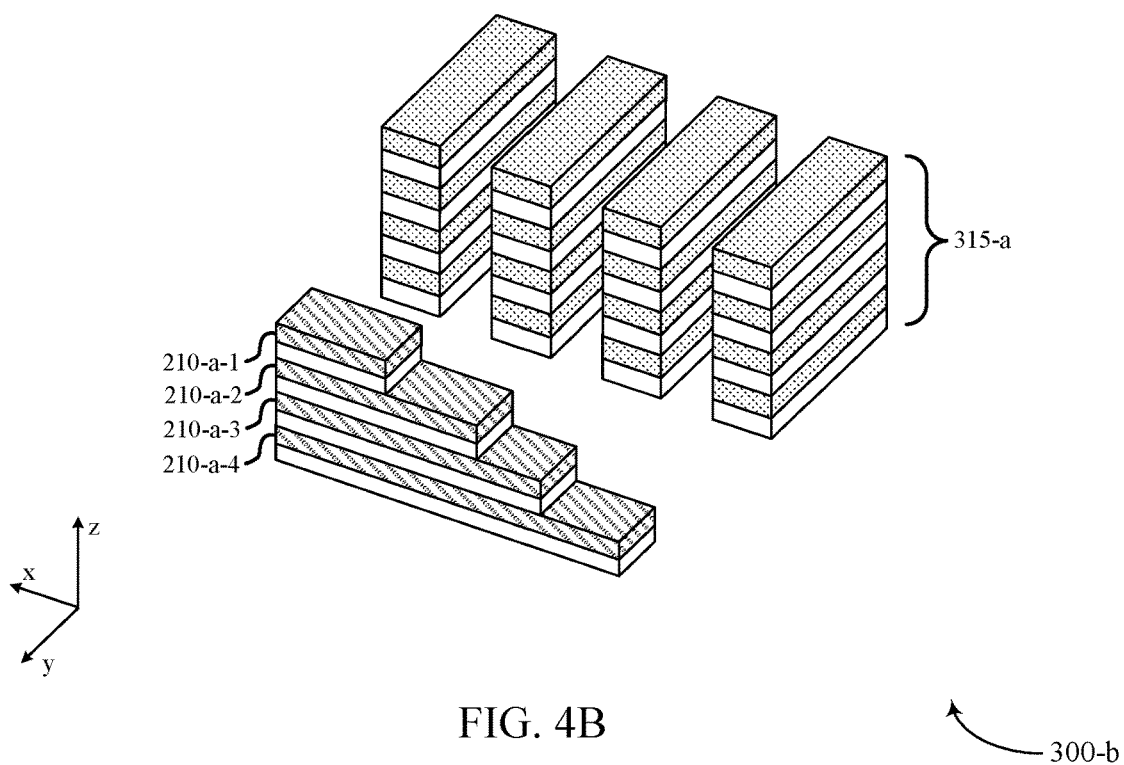

FIGS. 4A and 4B illustrate an example of the material arrangement 300 (e.g., as a material arrangement 300-*b*) that supports structures for word line multiplexing in three-dimensional memory arrays in accordance with examples as disclosed herein. The material arrangement 300-*b* may show at least a portion of a memory die 100 after a second set of one or more manufacturing operations, which may include operations that are performed before, after, or concurrently with the first set of manufacturing operations described with reference to the material arrangement 300-*a*.

The second set of manufacturing operations may include forming a staircase pattern in the stack of word line conductors 210-*a*. For example, forming the staircase pattern may include performing one or more material removal operations such as one or more etching operations. In some cases, the material removal operations may include removing portions of word line conductors 210-*a* and respective layers of the dielectric material 240, such that each word line conductor 210-*a* has a different extent along the x-direction. For example, a word line conductor 210-*a*-4 may have a greater extent along the x-direction than a word line conductor 210-*a*-3, and so on. Thus, a portion of the word line conductor 210-*a*-4 may not be covered by the word line conductor 210-*a*-3 or a respective layer of the dielectric material 240 (e.g., in an xy-plane, as viewed along the z-direction), and so on. Uncovered portions of the word line conductors 210-*a* in the staircase regions 270 may be referred to as a tier or a step (e.g., a step of a staircase arrangement). Although the staircase pattern shown in FIG. 4B includes four tiers (e.g., four steps), a staircase pattern in accordance with the described techniques may include any quantity of one or more tiers, which may correspond to a quantity of levels of memory cells 105 (e.g., along the z-direction) in a memory array.

Figure 5A:
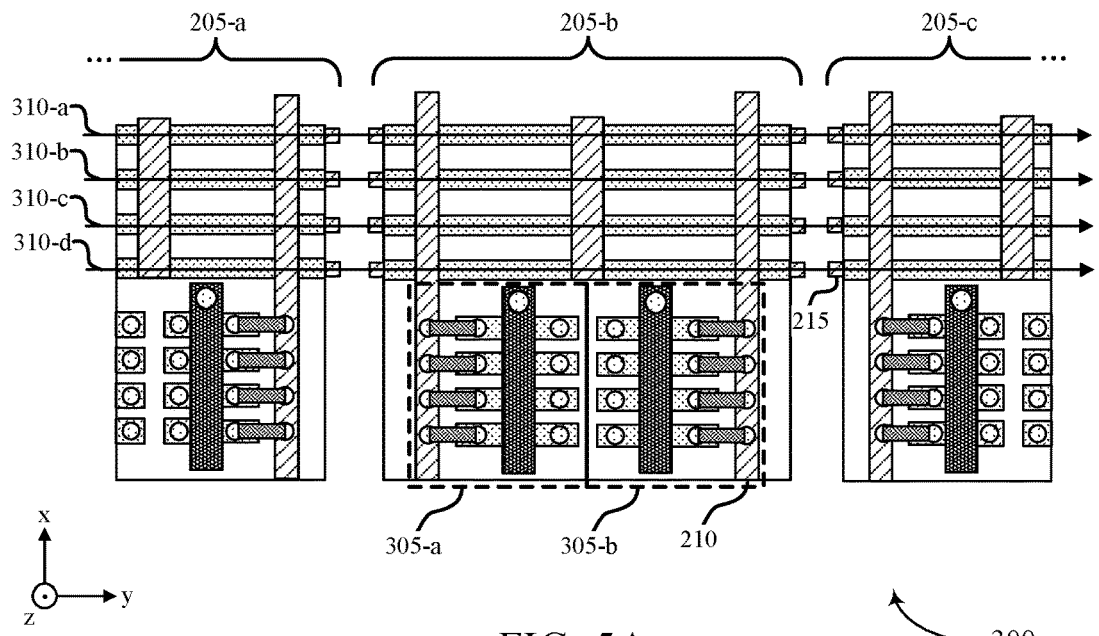
Figure 5B:
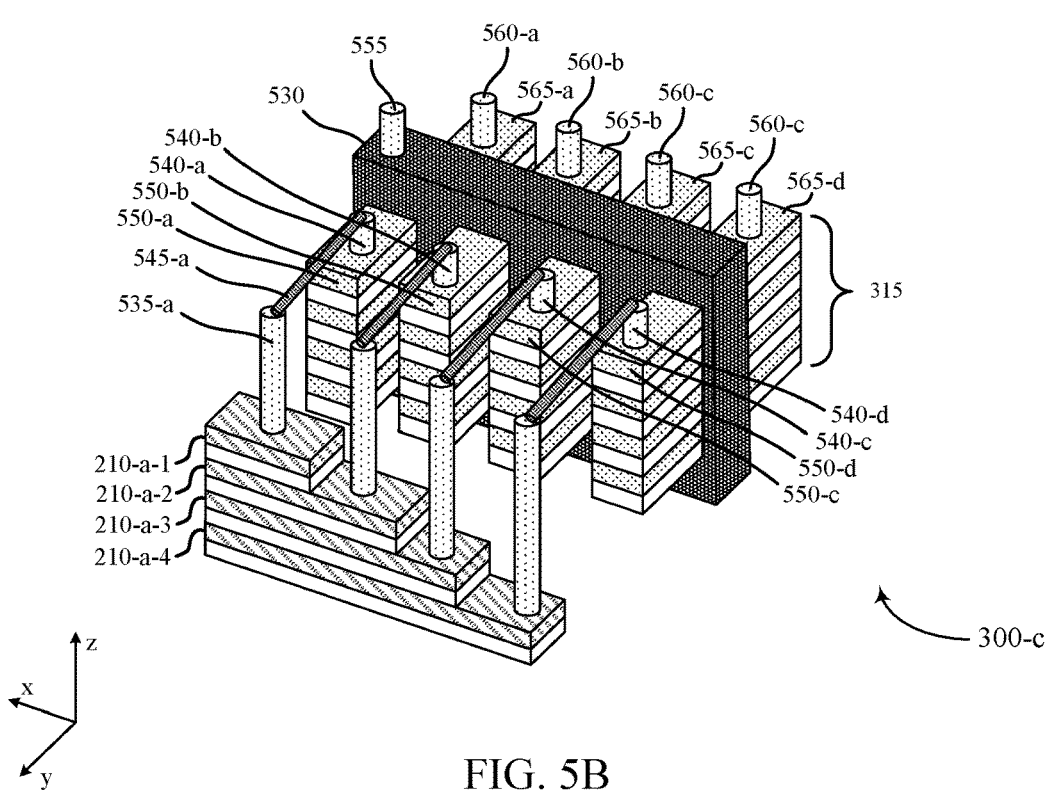

FIGS. 5A and 5B illustrate an example of the material arrangement 300 (e.g., as a material arrangement 300-*c*) that supports structures for word line multiplexing in three-dimensional memory arrays in accordance with examples as disclosed herein. The material arrangement 300-*c* may show at least a portion of a memory die 100 after a third set of one or more manufacturing operations, which may include operations that are performed after or concurrently with the second set of manufacturing operations described with reference to the material arrangement 300-*b*.

The third set of manufacturing operations may include forming a set of first portions 550 of the semiconductor material 230 and forming a set of second portions 565 of the semiconductor material 230. In some examples, a set of multiple first portions 550 may be arranged along the x-direction, and a set of multiple second portions 565 may be arranged along the x-direction. Each first portion 550 may be electrically coupled with a respective word line conductor 210-*a*. For example, the first portion 550-*a* may be coupled with the word line conductor 210-*a*-1 (e.g., via an electrical contact 535-*a*, an electrical coupling 545-*a*, and an electrical contact 540-*a*), and so on. In some cases, the first portions 550 may be located between (e.g., along the y-direction) the second portions 565 and the word line conductors 210-*a*. In some examples, each second portion 565 may be coupled with decoder circuitry (e.g., word line decoder circuitry, a row decoder 120).

Each first portion 550 and each second portion 565 may have a respective extent along the z-direction. In some cases, respective extents (e.g., of one or more first portion 550 and one or more second portion 565) may at least partially overlap (e.g., in the z-direction). That is, each first portion 550 may be aligned in the z-direction with at least one respective second portion 565 (e.g., due to being formed from a common layer of the semiconductor material 230). In some examples, forming the first portions 550 and the second portions 565 may include forming a trench through islands 320 (e.g., dividing islands 320 into two portions). In some such examples, the third set of manufacturing operations may include forming a gate material portion 530 in the trench. The gate material portion 530 may include the gate material 505. The gate material portion 530 may be an example of a gate portion that is operable to modulate a conductivity between first portions 550 and second portions 565. For example, applying a voltage to the gate material portion 530 may modulate a conductivity (e.g., form a conductive path, form a closed circuit, activate a channel) between the first portion 550-*a* and the second portion 565-*a*, and modulate a conductivity between the first portion 550-*b* and the second portion 565-*b*, and so on. In some cases, the voltage may be applied to the gate material portion 530 via an electrical contact 555, which may be coupled with decoder circuitry (e.g., word line decoder circuitry, a row decoder 120).

In some examples, the gate material portion 530 may be formed in contact with the first portions 550 and the second portions 565. However, in some other examples, one or more materials may be formed between the gate material portion 530 and the portions of semiconductor material 230 (e.g., first portions 550 and second portions 565). For example, a gate oxide may be formed on sidewalls of the gate material portion 530, or on sidewalls of the first portions 550 or second portions 565, among other configurations. That is, a gate oxide may be formed between the gate material portion 530 and respective portions of the semiconductor material 230. In some cases, a gate oxide material may be formed prior to forming the gate material portion 530.

In some cases, the third set of manufacturing operations may include forming one or more electrical contacts (e.g., one or more electrical contacts 535, one or more electrical contacts 540, one or more electrical contacts 555, and one or more electrical contacts 560, electrical couplings), which may involve forming one or more portions of conductive material (e.g., a conductive material 510, one or more different conductive materials). The conductive material 510 may be the same as the conductive material 255, the conductive material 515, or both, or may be a different conductive material. In some cases, forming the one or more electrical contacts may include performing a material removal operation (e.g., forming one or more cavities along the z-direction) to create an open space that is coincident with (e.g., extends through) one or more layers of the stack 315, and depositing the conductive material 510 in the open space.

Each of the electrical contacts 560-*a* through 560-*d* may be coupled with a respective first access line (not shown), such as a respective global word line conductor, of a word line driver (e.g., of a row decoder 120). In some examples, each global word line conductor may be coupled with a set of multiple electrical contacts 560 (e.g., along the y-direction), such as multiple electrical contacts 560 of a region 205, or multiple contacts 560 of multiple regions 205, among other configurations. For example, the electrical contact 560-*a* of the region 305-*a* may be coupled with a same global word line as a corresponding contact 560 of the region 305-*b* (e.g., such that the second portion 565-*a* is coupled with a corresponding second portion 565 of the region 305-*b*), and the electrical contact 560-*b* of the region 305-*a* may be coupled with a same global word line as a corresponding electrical contact 560 of the region 305-*b*, and so on. In some other examples, electrical contacts 560 may be shared across multiple regions 305 (not shown). For example, the contact 560-*a* may be illustrative of a contact 560 that is shared between the region 305-*a* and the region 350-*b*, in which case the second portion 565-*a* also may be shared between (e.g., extend into) each of the region 305-*a* and the region 305-*b*. In some examples, each global word line conductor may be coupled with multiple electrical contacts 560 of multiple regions 205, among other configurations. Thus, electrical contacts 560 may correspond to a first level (e.g., a first granularity) of word line decoding. Each of the electrical contacts 555 may be coupled with a respective second access line (not shown), such as a phase selection line or an even/odd selection line. In some examples, conductors between decoding circuitry and the electrical contacts 560, or the electrical contacts 555, or both may be formed on a common level as global digit lines 310, or on different levels (e.g., different routing levels), among other configurations.

In some examples, an electrical contact (e.g., an electrically conductive pillar) may couple multiple layers of materials (e.g., couple one or more layers of the stack 315), which may be based at least in part on a depth of the formed electrical contact along the z-direction. For example, an electrical contact 540 may be formed through a set of multiple first portions 550 (e.g., along the z-direction), and may electrically couple each first portion 550 of the set. In an illustrative example, the electrical contact 540-*a* may be formed through the first portion 550-*a* and one or more additional first portions 550 that are below the first portion 550-*a* (e.g., along the z-direction). Additionally, or alternatively, an electrical contact 560 may be formed through a set of multiple second portions 565 (e.g., along the z-direction), and may electrically couple each second portion 565 of the set. In some examples, coupling multiple first portions 550 via an electrical contact 540, or coupling multiple second portions 565 via an electrical contact 560, or both may be implemented to increase a capacity of a channel (e.g., a transistor channel) activated by the gate material portion 530.

In some cases, an electrical contact may not extend through multiple layers of a stack of materials (e.g., of a stack 315). For example, the electrical contact 540-*a* may be electrically coupled with the first portion 550-*a*, but not additional first portions 550 that are below the first portion 550-*a* (e.g., along the z-direction). In another example, a respective electrical contact 535 may be formed for each respective word line conductor 210 and may not extend through the dielectric material 240 that is below the respective word line conductor 210 (e.g., such that the electrical contact 535-*a* may be electrically coupled with the word line conductor 210-*a*-1, but not the word line conductor 210-*a*-2, and so on).

The third set of manufacturing operations may also include forming (e.g., using a conductive material 515) electrical couplings 545 between electrical contacts (e.g., between an electrical contact 535 and a respective electrical contact 540). For example, an electrical coupling 545-*a* may be formed between an electrical contact 535-*a* and an electrical contact 540-*a*. In some cases, the conductive material 515 may be different from the conductive material 255. In some other cases, the conductive material 515 may be a same material as the conductive material 255. In some examples, each of the electrical couplings 545 may be at least partially overlapping along the z-direction, such as for configurations in which electrical couplings 545 are formed in a metal layer of the material arrangement 300, such as a routing layer (e.g., a routing layer that includes one or more of global digit lines, global word lines, or other word line decoding conductors). In some examples, the third set of manufacturing operations, or one or more preceding or following operations, may include depositing a dielectric material in gaps between the features illustrated in FIGS. 5A and 5B, which may be the same as or different than the dielectric material 240, and which may support a degree of electrical isolation between the illustrated components.

In some cases, a memory die 100 may include multiple word line conductor 210 multiplexing circuits. For example, a memory die 100 may include features illustrated in FIG. 5B in multiple regions 305 (e.g., including the features of FIG. 5B in the region 305-*a* and features similar to those of FIG. 5B, mirrored across an xz-plane, in the region 305-*b*). Accordingly, some word line conductor 210 multiplexing operations may be performed by applying a voltage to a global word line (e.g., coupled with both the region 305-*a* and the region 305-*b*) and determining whether to modulate a conductivity of a first gate material 505 (e.g., of the region 305-*a*), a second gate material 505 (e.g., of the region 305-*b*), or both, which may support dividing the decoding of one or more word line conductors 210 into different sets of access lines, which may reduce aspects of word line decoding complexity. For example, the described techniques for multiplexing word line conductors 210 may enable a single global word line to apply a voltage to multiple word line conductors 210. For example, a global word line may be electrically coupled with the electrical contact 560-*a* (e.g., of the region 305-*a*) and a corresponding electrical contact of a second word line conductor 210 multiplexing circuit (e.g., of the region 305-*b*). Accordingly, the voltage applied to the global word line may be operable to be applied to both a first word line conductor 210 and a corresponding word line conductor for the second word line conductor 210 multiplexing circuit.

Figure 6:
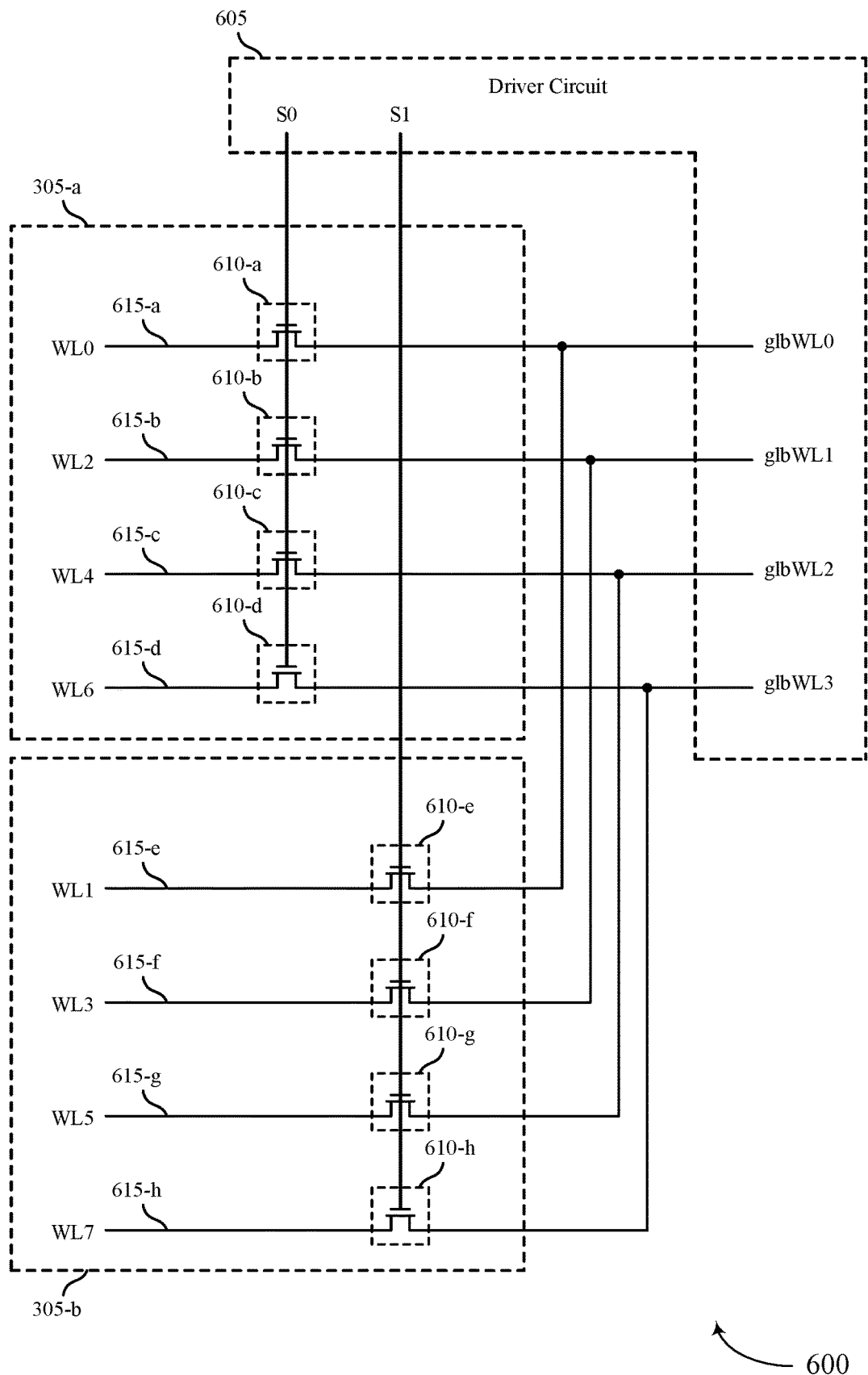
FIG. 6 illustrates an example of a circuit that supports structures for word line multiplexing in three-dimensional memory arrays in accordance with examples as disclosed herein

FIG. 6 illustrates an example of a circuit 600 that supports structures for word line multiplexing in three-dimensional memory arrays in accordance with examples as disclosed herein. The circuit 600 illustrates an example of circuit elements that may be implemented in accordance with the material arrangement 300. For example, the circuit 600 illustrates circuitry that may be included in or otherwise associated with the regions 305-*a* and 305-*b*, which may be coupled with a driver circuit 605 (e.g., of a row decoder 120). In some examples, the circuit 600 may illustrate aspects of a one-transistor (1T) NMOS driver.

The circuit includes transistors 610, each of which may include a channel portion associated with one or more first portions 550 of the semiconductor material 230 and one or more second portions 565 of the semiconductor material. Although the material arrangement 300 illustrates an example in which the first portions 550 and the second portions 565 are separated by gate material portions 530, the transistors 610 may implement other configurations of the semiconductor material 230 (e.g., a semiconductor material that is also used for forming switching components 135) or, more generally, may implement different examples of semiconductor material formed over a semiconductor substrate (e.g., deposited over a substrate, formed in an epitaxy operation, formed in layers corresponding to different decks of memory cells 105 along the z-direction).

Each transistor 610 includes a gate portion operable to activate the channel of the transistor 610, which may be associated with modulating a conductivity between the respective first portions of 550 and second portions 565, among other modulation of a conductivity of the respective transistor channel. In the example of circuit 600, the transistors 610 of a region 305 may share a common gate node, operable to receive a phase signal (e.g., S0, S1, an even/odd signal), which may be associated with a gate material portion 530. For example, the transistors 610-*a* through 610-*d* of the region 305-*a* may be operable to receive a signal S0 (e.g., via an electrical contact 555), and the transistors 610-*e* through 615-*h* of the region 305-*b* may be operable to receive a signal S1. Respective transistors 610 of each region 305 may be operable to receive a common global word line signal (e.g., one of glbWL0 through glbWL3, a decoded word line driver signal, at a first end of a channel of the respective transistors 610). For example, the transistor 610-*a* of the region 305-*a* and the transistor 610-*e* of the region 305-*b* may be operable to receive a signal glbWL0, and so on.

The circuit 600 illustrates word lines 615, which may be examples of word lines 110. Each of the word lines 615 may include a respective word line conductor 210, such as the arrangement of word line conductors 210-*a*-1 through 210-*a*-4 of the material arrangement 300. Activating a given word line 615 may be based on the driver circuit 605 activating a first signal (e.g., a particular global word line signal) and a second signal (e.g., particular phase signal). For example, to activate the word line 615-*a* (e.g., to activate WL0, to activate the word line conductor 210-*a*-1), the driver circuit 605 may activate the global word line glbWL0 (e.g., biasing the electrical contact 560-*a* of the region 305-*a* with an activation voltage) and activate the phase signal S0 (e.g., biasing the electrical contact 555 of the region 305-*a* with an activation voltage). In such examples, first portions 550 of the transistors 610-*e* through 610-*h* may be floating (e.g., of the region 305-*b*), which may be based on applying phase signal S1 with a deactivation voltage. Moreover, deactivated global word lines may be biased with a deactivation signal (e.g., a ground voltage, a negative voltage), to prevent inadvertent activation of memory cells 105 (e.g., switching components 135) coupled with the deactivated global word lines (e.g., memory cells 105 coupled with word line 615-*b*, as coupled with global word line signal glbWL1 via the transistor 610-*b* that is activated by the phase signal S0, and so on).

Thus, in accordance with these and other examples, a memory die may include circuitry for access line multiplexing, such as multiplexing of word line conductors 210, in regions 275 that are adjacent to or between staircase regions (e.g., staircase regions 270). In some examples, such features may support various techniques for multiplexing associated with the stack of word line conductors 210, or among multiple stacks of word line conductors 210 (e.g., associated with a set of multiple regions 275), or both, and therefore utilize a region of the memory die that might be otherwise unused for active circuitry of the memory die.

Figure 7:
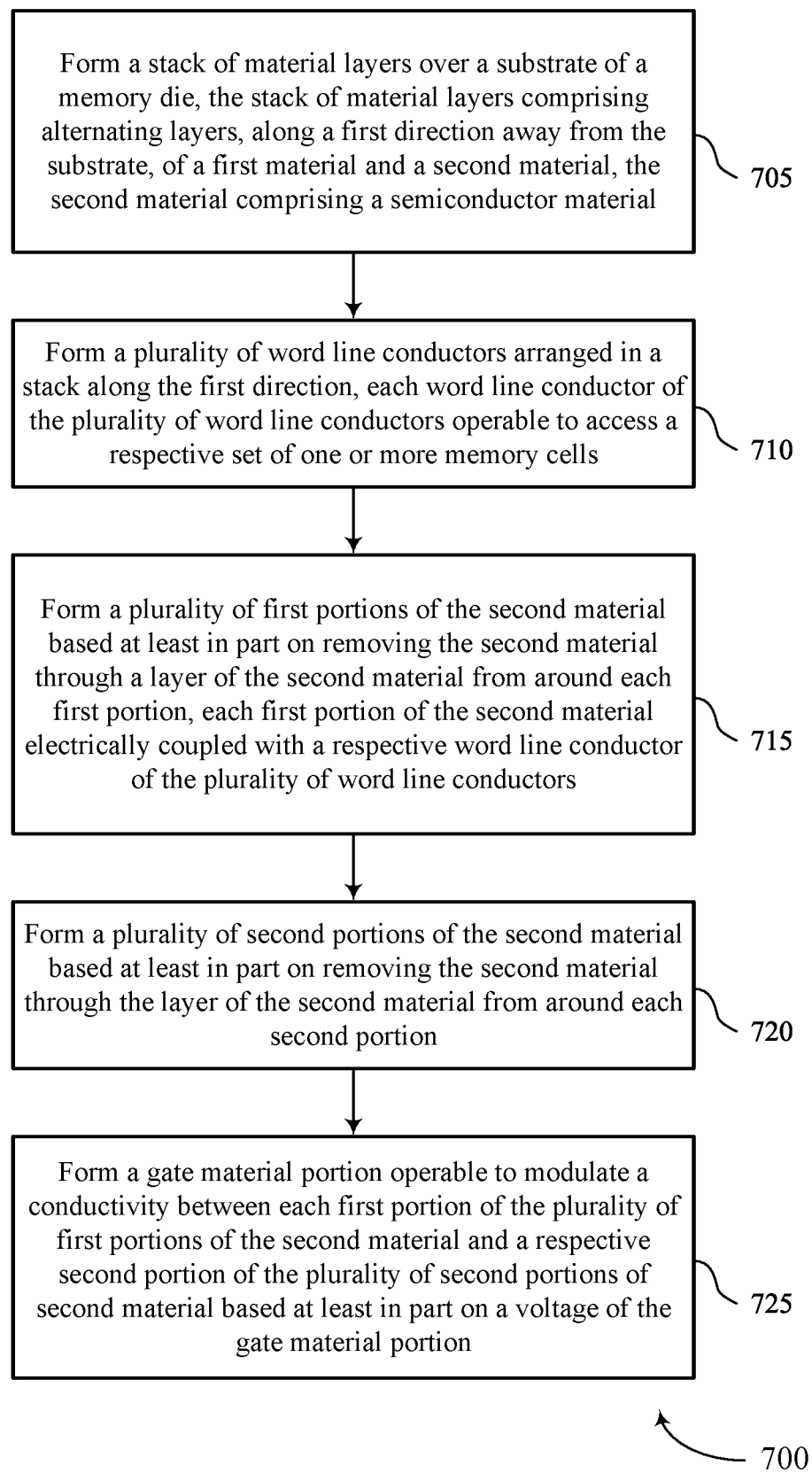
FIG. 7 illustrates an example of a flowchart that supports structures for word line multiplexing in three-dimensional memory arrays in accordance with examples as disclosed herein.

FIG. 7 shows a flowchart illustrating a method 700 that supports structures for word line multiplexing in three-dimensional memory arrays in accordance with examples as disclosed herein. The operations of method 700 may be implemented by a manufacturing system or one or more controllers associated with a manufacturing system. In some examples, one or more controllers may execute a set of instructions to control one or more functional elements of the manufacturing system to perform the described functions. Additionally, or alternatively, the one or more controllers may perform aspects of the described functions using special-purpose hardware.

At 705, the method may include forming a stack of material layers over a substrate of a memory die, the stack of material layers including alternating layers, along a first direction away from the substrate, of a first material and a second material, the second material including a semiconductor material. The operations of 705 may be performed in accordance with examples as disclosed herein.

At 710, the method may include forming a plurality of word line conductors arranged in a stack along the first direction, each word line conductor of the plurality of word line conductors operable to access a respective set of one or more memory cells. The operations of 710 may be performed in accordance with examples as disclosed herein.

At 715, the method may include forming a plurality of first portions of the second material based at least in part on removing the second material through a layer of the second material from around each first portion, each first portion of the second material electrically coupled with a respective word line conductor of the plurality of word line conductors. The operations of 715 may be performed in accordance with examples as disclosed herein.

At 720, the method may include forming a plurality of second portions of the second material based at least in part on removing the second material through the layer of the second material from around each second portion. The operations of 720 may be performed in accordance with examples as disclosed herein.

At 725, the method may include forming a gate material portion operable to modulate a conductivity between each first portion of the plurality of first portions of the second material and a respective second portion of the plurality of second portions of second material based at least in part on a voltage of the gate material portion. The operations of 725 may be performed in accordance with examples as disclosed herein.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a stack of material layers over a substrate of a memory die, the stack of material layers including alternating layers, along a first direction away from the substrate, of a first material and a second material, the second material including a semiconductor material; forming a plurality of word line conductors arranged in a stack along the first direction, each word line conductor of the plurality of word line conductors operable to access a respective set of one or more memory cells; forming a plurality of first portions of the second material based at least in part on removing the second material through a layer of the second material from around each first portion, each first portion of the second material electrically coupled with a respective word line conductor of the plurality of word line conductors; forming a plurality of second portions of the second material based at least in part on removing the second material through the layer of the second material from around each second portion; and forming a gate material portion operable to modulate a conductivity between each first portion of the plurality of first portions of the second material and a respective second portion of the plurality of second portions of second material based at least in part on a voltage of the gate material portion.

Aspect 2: The method, apparatus, or non-transitory computer-readable medium of aspect 1, further including operations, features, circuitry, logic, means, or instructions, or any combination thereof for forming a plurality of islands of the stack of material layers based at least in part on removing the layers of the first material and the second material from a perimeter around each island of the plurality of islands, where forming the plurality of first portions of the second material and forming the plurality of second portions of the second material is based at least in part on forming a trench through the plurality of islands of the stack of material layers.

Aspect 3: The method, apparatus, or non-transitory computer-readable medium of aspect 2, where forming the gate material portion is based at least in part on depositing the gate material in the trench.

Aspect 4: The method, apparatus, or non-transitory computer-readable medium of any of aspects 1 through 3, further including operations, features, circuitry, logic, means, or instructions, or any combination thereof for forming a respective electrical coupling between each first portion of the second material and the respective word line conductor based at least in part on forming a respective cavity coincident with the respective word line conductor and depositing a conductive material in the respective cavity.

Aspect 5: The method, apparatus, or non-transitory computer-readable medium of any of aspects 1 through 4, further including operations, features, circuitry, logic, means, or instructions, or any combination thereof for forming a plurality of voids based at least in part on removing portions of the second material from between the layers of the first material, and forming the plurality of word line conductors based at least in part on depositing a conductive material in the plurality of voids.

Aspect 6: The method, apparatus, or non-transitory computer-readable medium of aspect 5, further including operations, features, circuitry, logic, means, or instructions, or any combination thereof for forming each word line conductor with a different extent along a second direction over the substrate.

Aspect 7: The method, apparatus, or non-transitory computer-readable medium of any of aspects 1 through 6, where each word line conductor is operable to access a respective plurality of memory cells that are associated with a respective layer of the second material.

Aspect 8: The method, apparatus, or non-transitory computer-readable medium of any of aspects 1 through 7, further including operations, features, circuitry, logic, means, or instructions, or any combination thereof for forming an electrical coupling between each second portion of the plurality of second portions of the second material and a word line driver circuit.

Aspect 9: The method, apparatus, or non-transitory computer-readable medium of any of aspects 1 through 8, further including operations, features, circuitry, logic, means, or instructions, or any combination thereof for forming, through each first portion of the plurality of first portions of the second material, a respective cavity coincident with the second material of at least one other layer of the second material and depositing a conductive material in each respective cavity to electrically couple the first portion of the second material with the second material of the at least one other layer.

Aspect 10: The method, apparatus, or non-transitory computer-readable medium of aspect 9, further including operations, features, circuitry, logic, means, or instructions, or any combination thereof for forming, through each second portion of the plurality of second portions of the second material, a respective second cavity coincident with the second material of the at least one other layer of the second material and depositing the conductive material in each respective second cavity to electrically couple the second portion of the second material with the second material of the at least one other layer.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus including: a plurality of word line conductors arranged in a stack along a first direction away from a substrate of a memory die, each word line conductor of the plurality of word line conductors extending along a second direction over the substrate and operable to access a respective set of one or more memory cells over the substrate; a plurality of first portions of a semiconductor material arranged along the second direction over the substrate, each first portion of the semiconductor material electrically coupled with a respective word line conductor of the plurality of word line conductors; and a gate material portion operable to modulate a respective conductivity between each first portion of the semiconductor material and a respective second portion of a plurality of second portions of the semiconductor material over the substrate based at least in part on a voltage of the gate material portion.

Aspect 12: The apparatus of aspect 11, where the plurality of first portions of the semiconductor material are located between the plurality of second portions of the semiconductor material and the plurality of word line conductors along a third direction over the substrate.

Aspect 13: The apparatus of any of aspects 11 through 12, where each first portion of the plurality of first portions of the semiconductor material and each second portion of the plurality of second portions of the semiconductor material has a respective extent along the first direction, and the respective extents along the first direction are at least partially overlapping along the first direction.

Aspect 14: The apparatus of any of aspects 11 through 13, further including: a gate dielectric material between the gate material portion and each first portion of the plurality of first portions of the semiconductor material and between the gate material portion and each second portion of the plurality of second portions of the semiconductor material.

Aspect 15: The apparatus of any of aspects 11 through 14, where each first portion of the plurality of first portions of the semiconductor material is included in a respective set of multiple first portions of the semiconductor material arranged along the first direction.

Aspect 16: The apparatus of aspect 15, where each first portion of the respective set of multiple first portions is electrically coupled with the respective word line conductor of the plurality of word line conductors via a conductive material along the first direction.

Aspect 17: The apparatus of any of aspects 11 through 16, where each second portion of the plurality of second portions of the semiconductor material is included in a respective set of multiple second portions of the semiconductor material arranged along the first direction.

Aspect 18: The apparatus of aspect 17, where each second portion of the respective set of multiple second portions is electrically coupled with one another via a conductive material along the first direction.

Aspect 19: The apparatus of any of aspects 11 through 18, where: each word line conductor of the plurality of word line conductors is separated from another word line conductor of the plurality of word line conductors by at least a portion of a dielectric material; each first portion of the plurality of first portions of the semiconductor material is separated from another first portion of the plurality of first portions of the semiconductor material along the second direction by at least a portion of a dielectric material; and each second portion of the plurality of second portions of the semiconductor material is separated from another second portion of the plurality of second portions of the semiconductor material along the second direction by at least a portion of the dielectric material.

Aspect 20: The apparatus of any of aspects 11 through 19, where each word line conductor of the plurality of word line conductors is associated with a different extent along the second direction.

Aspect 21: The apparatus of any of aspects 11 through 20, further including: a set of one or more digit line conductors, each digit line conductor of the set of one or more digit line conductors extending along the first direction, where each word line conductor is operable to couple a storage element of the respective set of one or more memory cells with each digit line conductor of the set of one or more digit line conductors.

Aspect 22: The apparatus of any of aspects 11 through 21, further including: a plurality of second word line conductors arranged along the first direction, each second word line conductor extending along the second direction and operable to access a respective set of one or more second memory cells over the substrate; a plurality of third portions of the semiconductor material arranged along the second direction, each third portion of the semiconductor material electrically coupled with a respective second word line conductor of the plurality of second word line conductors; and a second gate material portion operable to modulate a conductivity between each third portion of the semiconductor material and a respective fourth portion of a plurality of fourth portions of the semiconductor material based at least in part on a voltage of the second gate material portion.

Aspect 23: The apparatus of aspect 22, where each fourth portion of the plurality of fourth portions of the semiconductor material is electrically coupled with a respective second portion of the plurality of second portions of the semiconductor material.

Aspect 24: The apparatus of any of aspects 22 through 23, where each memory cell of the respective sets of one or more memory cells and each second memory cell of the respective sets of one or more second memory cells is electrically coupled with a same plate node of the memory die.

An apparatus is described. The following provides an overview of aspects of the apparatus as described herein:

Aspect 25: An apparatus formed by a process including: forming a stack of material layers over a substrate of a memory die, the stack of material layers including alternating layers, along a first direction away from the substrate, of a first material and a second material, the second material including a semiconductor material; forming a plurality of word line conductors arranged in a stack along the first direction, each word line conductor of the plurality of word line conductors operable to access a respective set of one or more memory cells; forming a plurality of first portions of the second material based at least in part on removing the second material through a layer of the second material from around each first portion, each first portion of the second material electrically coupled with a respective word line conductor of the plurality of word line conductors; forming a plurality of second portions of the second material based at least in part on removing the second material through the layer of the second material from around each second portion; and forming a gate material portion operable to modulate a conductivity between each first portion of the plurality of first portions of the second material and a respective second portion of the plurality of second portions of second material based at least in part on a voltage of the gate material portion.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors or gates (e.g., gate material 505).

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the terms "electrical contact," "conductive pillar," and "electrical coupling," may refer to an electrical conductor, and in some examples, may be employed as an electrical contact to a memory cell or other component of a memory array. An electrical contact, conductive pillar, and electrical coupling may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a digital signal processor (DSP), an application-specific integrated circuit (ASIC), a field-programmable gate array (FPGA), discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus comprising:
   a plurality of word line conductors arranged in a stack along a first direction away from a substrate of a memory die, each word line conductor of the plurality of word line conductors extending along a second direction over the substrate and operable to access a respective set of one or more memory cells over the substrate;
   a plurality of first portions of a semiconductor material arranged along the second direction and located between a plurality of second portions of the semiconductor material and the plurality of word line conductors along a third direction over the substrate, each first portion of the semiconductor material electrically coupled with a respective word line conductor of the plurality of word line conductors; and
   a gate material portion operable to modulate a respective conductivity between each first portion of the semiconductor material and a respective second portion of the plurality of second portions of the semiconductor material over the substrate based at least in part on a voltage of the gate material portion.

2. The apparatus of claim 1, further comprising:
a gate dielectric material between the gate material portion and each first portion of the plurality of first portions of the semiconductor material and between the gate material portion and each second portion of the plurality of second portions of the semiconductor material.

3. The apparatus of claim 1, wherein each word line conductor of the plurality of word line conductors is associated with a different extent along the second direction.

4. The apparatus of claim 1, further comprising:
a set of one or more digit line conductors, each digit line conductor of the set of one or more digit line conductors extending along the first direction, wherein each word line conductor is operable to couple a storage element of the respective set of one or more memory cells with each digit line conductor of the set of one or more digit line conductors.

5. The apparatus of claim 1, wherein each first portion of the plurality of first portions of the semiconductor material and each second portion of the plurality of second portions of the semiconductor material has a respective extent along the first direction, and wherein the respective extents along the first direction are at least partially overlapping along the first direction.

6. The apparatus of claim 1, wherein each first portion of the plurality of first portions of the semiconductor material is included in a respective set of multiple first portions of the semiconductor material arranged along the first direction.

7. The apparatus of claim 6, wherein each first portion of the respective set of multiple first portions is electrically coupled with the respective word line conductor of the plurality of word line conductors via a conductive material along the first direction.

8. The apparatus of claim 1, wherein each second portion of the plurality of second portions of the semiconductor material is included in a respective set of multiple second portions of the semiconductor material arranged along the first direction.

9. The apparatus of claim 8, wherein each second portion of the respective set of multiple second portions is electrically coupled with one another via a conductive material along the first direction.

10. The apparatus of claim 1, wherein:
each word line conductor of the plurality of word line conductors is separated from another word line conductor of the plurality of word line conductors by at least a first portion of a dielectric material;
each first portion of the plurality of first portions of the semiconductor material is separated from another first portion of the plurality of first portions of the semiconductor material along the second direction by at least a second portion of the dielectric material; and
each second portion of the plurality of second portions of the semiconductor material is separated from another second portion of the plurality of second portions of the semiconductor material along the second direction by at least a third portion of the dielectric material.

11. An apparatus comprising:
a plurality of word line conductors arranged in a stack along a first direction away from a substrate of a memory die, each word line conductor of the plurality of word line conductors extending along a second direction over the substrate and operable to access a respective set of one or more memory cells over the substrate;
a plurality of first portions of a semiconductor material arranged along the second direction, each first portion of the semiconductor material electrically coupled with a respective word line conductor of the plurality of word line conductors; and
a gate material portion operable to modulate a respective conductivity between each first portion of the semiconductor material and a respective second portion of a plurality of second portions of the semiconductor material over the substrate based at least in part on a voltage of the gate material portion, wherein each first portion of the plurality of first portions of the semiconductor material and each second portion of the plurality of second portions of the semiconductor material has a respective extent along the first direction, and wherein the respective extents along the first direction are at least partially overlapping along the first direction.

12. The apparatus of claim 11, further comprising:
a plurality of second word line conductors arranged along the first direction, each second word line conductor extending along the second direction and operable to access a respective set of one or more second memory cells over the substrate;
a plurality of third portions of the semiconductor material arranged along the second direction, each third portion of the semiconductor material electrically coupled with a respective second word line conductor of the plurality of second word line conductors; and
a second gate material portion operable to modulate a conductivity between each third portion of the semiconductor material and a respective fourth portion of a plurality of fourth portions of the semiconductor material based at least in part on a voltage of the second gate material portion.

13. The apparatus of claim 11, further comprising:
a gate dielectric material between the gate material portion and each first portion of the plurality of first portions of the semiconductor material and between the gate material portion and each second portion of the plurality of second portions of the semiconductor material.

14. The apparatus of claim 11, wherein each first portion of the plurality of first portions of the semiconductor material is included in a respective set of multiple first portions of the semiconductor material arranged along the first direction.

15. The apparatus of claim 14, wherein each first portion of the respective set of multiple first portions is electrically coupled with the respective word line conductor of the plurality of word line conductors via a conductive material along the first direction.

16. The apparatus of claim 11, wherein each second portion of the plurality of second portions of the semiconductor material is included in a respective set of multiple second portions of the semiconductor material arranged along the first direction.

17. The apparatus of claim 16, wherein each second portion of the respective set of multiple second portions is electrically coupled with one another via a conductive material along the first direction.

18. The apparatus of claim 11, wherein each word line conductor of the plurality of word line conductors is associated with a different extent along the second direction.

19. An apparatus comprising:
a plurality of word line conductors arranged in a stack along a first direction away from a substrate of a memory die, each word line conductor of the plurality of word line conductors extending along a second direction over the substrate and operable to access a respective set of one or more memory cells over the substrate;
a plurality of first portions of a semiconductor material arranged along the second direction, wherein each first portion of the semiconductor material electrically coupled with a respective word line conductor of the plurality of word line conductors, and wherein each first portion of the plurality of first portions of the semiconductor material is included in a respective set of multiple first portions of the semiconductor material arranged along the first direction; and
a gate material portion operable to modulate a respective conductivity between each first portion of the semiconductor material and a respective second portion of a plurality of second portions of the semiconductor material over the substrate based at least in part on a voltage of the gate material portion.

20. The apparatus of claim 19, wherein each first portion of the respective set of multiple first portions is electrically coupled with the respective word line conductor of the plurality of word line conductors via a conductive material along the first direction.

21. An apparatus comprising:
a plurality of word line conductors arranged in a stack along a first direction away from a substrate of a memory die, each word line conductor of the plurality of word line conductors extending along a second direction over the substrate and operable to access a respective set of one or more memory cells over the substrate;
a plurality of first portions of a semiconductor material arranged along the second direction, each first portion of the semiconductor material electrically coupled with a respective word line conductor of the plurality of word line conductors; and
a gate material portion operable to modulate a respective conductivity between each first portion of the semiconductor material and a respective second portion of a plurality of second portions of the semiconductor material over the substrate based at least in part on a voltage of the gate material portion, wherein each second portion of the plurality of second portions of the semiconductor material is included in a respective set of multiple second portions of the semiconductor material arranged along the first direction.

22. The apparatus of claim 21, wherein each second portion of the respective set of multiple second portions is electrically coupled with one another via a conductive material along the first direction.

23. An apparatus comprising:
a plurality of word line conductors arranged in a stack along a first direction away from a substrate of a memory die, each word line conductor of the plurality of word line conductors extending along a second direction over the substrate and operable to access a respective set of one or more memory cells over the substrate;
a plurality of first portions of a semiconductor material arranged along the second direction, each first portion of the semiconductor material electrically coupled with a respective word line conductor of the plurality of word line conductors; and
a gate material portion operable to modulate a respective conductivity between each first portion of the semiconductor material and a respective second portion of a plurality of second portions of the semiconductor material over the substrate based at least in part on a voltage of the gate material portion, wherein:
each word line conductor of the plurality of word line conductors is separated from another word line conductor of the plurality of word line conductors by at least a first portion of a dielectric material;
each first portion of the plurality of first portions of the semiconductor material is separated from another first portion of the plurality of first portions of the semiconductor material along the second direction by at least a second portion of the dielectric material; and
each second portion of the plurality of second portions of the semiconductor material is separated from another second portion of the plurality of second portions of the semiconductor material along the second direction by at least a third portion of the dielectric material.

24. An apparatus, comprising:
a plurality of first word line conductors arranged in a stack along a first direction away from a substrate of a memory die, each first word line conductor of the plurality of first word line conductors extending along a second direction over the substrate and operable to access a respective set of one or more first memory cells over the substrate;
a plurality of first portions of a semiconductor material arranged along the second direction, each first portion of the semiconductor material electrically coupled with a respective word line conductor of the plurality of first word line conductors;
a first gate material portion operable to modulate a respective conductivity between each first portion of the semiconductor material and a respective second portion of a plurality of second portions of the semiconductor material over the substrate based at least in part on a voltage of the first gate material portion;
a plurality of second word line conductors arranged along the first direction, each second word line conductor extending along the second direction and operable to access a respective set of one or more second memory cells over the substrate;
a plurality of third portions of the semiconductor material arranged along the second direction, each third portion of the semiconductor material electrically coupled with a respective second word line conductor of the plurality of second word line conductors; and
a second gate material portion operable to modulate a conductivity between each third portion of the semiconductor material and a respective fourth portion of a plurality of fourth portions of the semiconductor material based at least in part on a voltage of the second gate material portion,
wherein each fourth portion of the plurality of fourth portions of the semiconductor material is electrically coupled with a respective second portion of the plurality of second portions of the semiconductor material.

25. An apparatus, comprising:
a plurality of first word line conductors arranged in a stack along a first direction away from a substrate of a memory die, each first word line conductor of the plurality of first word line conductors extending along a second direction over the substrate and operable to access a respective set of one or more first memory cells over the substrate;

a plurality of first portions of a semiconductor material arranged along the second direction, each first portion of the semiconductor material electrically coupled with a respective word line conductor of the plurality of first word line conductors;

a first gate material portion operable to modulate a respective conductivity between each first portion of the semiconductor material and a respective second portion of a plurality of second portions of the semiconductor material over the substrate based at least in part on a voltage of the first gate material portion;

a plurality of second word line conductors arranged along the first direction, each second word line conductor extending along the second direction and operable to access a respective set of one or more second memory cells over the substrate;

a plurality of third portions of the semiconductor material arranged along the second direction, each third portion of the semiconductor material electrically coupled with a respective second word line conductor of the plurality of second word line conductors; and a second gate material portion operable to modulate a conductivity between each third portion of the semiconductor material and a respective fourth portion of a plurality of fourth portions of the semiconductor material based at least in part on a voltage of the second gate material portion, wherein each memory cell of the respective sets of one or more first memory cells and each second memory cell of the respective sets of one or more second memory cells is electrically coupled with a same plate node of the memory die.

* * * * *